United States Patent
Tregilgas et al.

Patent Number: 5,861,321
Date of Patent: Jan. 19, 1999

[54] METHOD FOR DOPING EPITAXIAL LAYERS USING DOPED SUBSTRATE MATERIAL

[75] Inventors: John H. Tregilgas, Richardson; Donald F. Weirauch, Dallas; John A. Dodge, Richardson; Sidney G. Parker, Dallas, all of Tex.

[73] Assignee: Texas Instruments Incorporated, Dallas, Tex.

[21] Appl. No.: 754,949

[22] Filed: Nov. 21, 1996

Related U.S. Application Data

[60] Provisional application No. 60/007,424 Nov. 21, 1995.
[51] Int. Cl.⁶ .................................................. H01L 21/208
[52] U.S. Cl. .............................................. 438/95; 438/502
[58] Field of Search .............................. 437/2, 3, 5, 161, 437/247, 160, 156, 81, 98, 106; 257/442; 250/338.4

[56] References Cited

U.S. PATENT DOCUMENTS

| | | | |
|---|---|---|---|
| 4,236,947 | 12/1980 | Baliga | 117/56 |
| 4,904,337 | 2/1990 | Elliott et al. | 417/103 |
| 4,927,773 | 5/1990 | Jack et al. | 437/162 |
| 5,137,838 | 8/1992 | Ramde et al. | 437/30 |
| 5,399,503 | 3/1995 | Saito et al. | 437/2 |
| 5,454,885 | 10/1995 | Dudoff et al. | 437/12 |
| 5,535,699 | 7/1996 | Kawazu et al. | 117/54 |

FOREIGN PATENT DOCUMENTS

| | | | |
|---|---|---|---|
| 1-220478A | 9/1989 | Japan | 437/3 |
| 03091934 | 4/1991 | Japan . | |

OTHER PUBLICATIONS

G. L. Destéfanis, "Electrical Doping of HgCdTe By Ion Implantation and Heat Treatment," *Journal of Crystal Growth* 86, 1988, pp. 700–722.

L. O. Bubulac, "Defects, Diffusion and Activation in Ion Implanted HgCdTe," *Journal of Crystal Growth* 86, 1988, pp. 723–734.

P. Bouchut, et al., "High–efficiency infrared light emitting diodes made in liquid phase epitaxy and molecular beam epitaxy HgCdTe layers," *J. Vac. Sci. Technol B*, vol. 9, No. 3, May/Jun., 1991, pp. 1794–1798.

G. Destefanis, et al., "Large Improvement in HgCdTe Photovoltaic Detector Performances at LETI," *Journal of Electronic Materials*, vol. 22, No. 8, 1993, pp. 1027–1032.

*Primary Examiner*—Jey Tsai
*Assistant Examiner*—S. Mulpuri
*Attorney, Agent, or Firm*—Lawrence J. Bassuk; Christopher L. Maginniss; Richard L. Donaldson

[57] ABSTRACT

A method is provided for producing an n-type or p-type epitaxial layer using a doped substrate material. The method includes growing a substrate (12), preferably from a material to which an epitaxial layer can be lattice-matched. The substrate (12) is doped with a predetermined concentration of dopant (14). Preferably, the dopant (14) possesses the ability to rapidly diffuse through a material. An epitaxial layer (16) is grown upon the doped substrate (12). The epitaxial layer (16) and the doped substrate are annealed, thereby causing the dopant (14) to diffuse from the substrate (14) into the epitaxial layer (16).

5 Claims, 1 Drawing Sheet

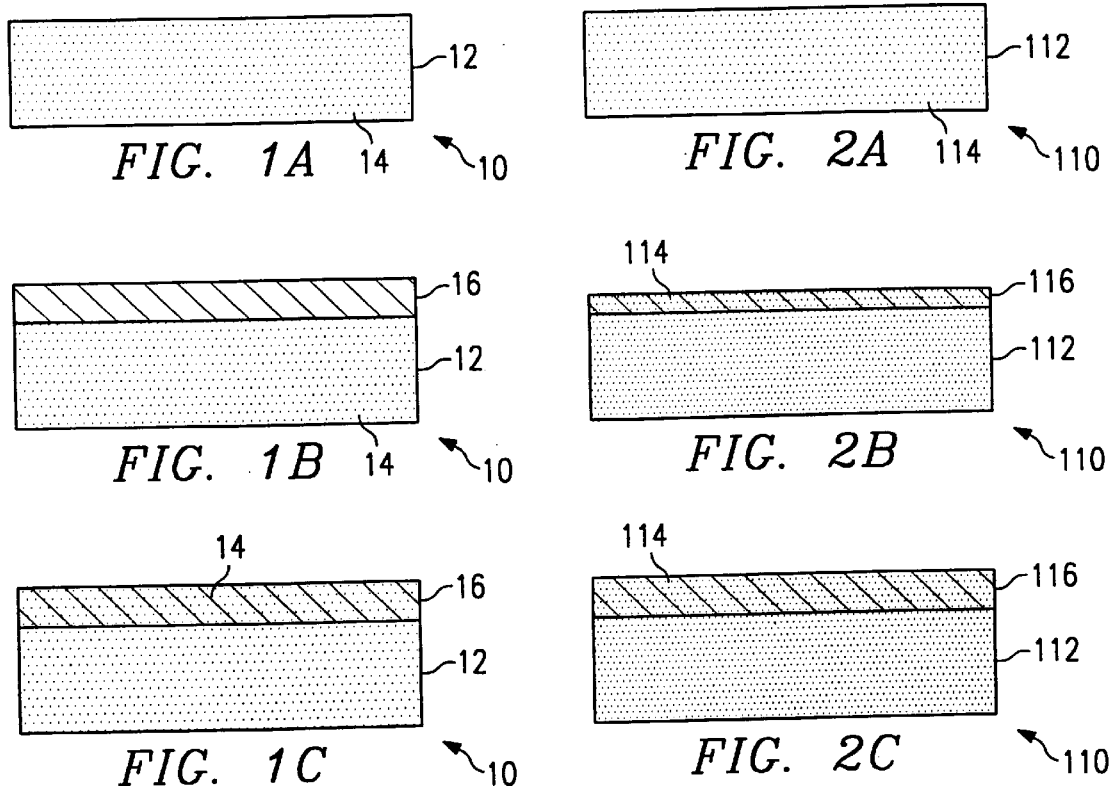

under 35 USC § 119(e)
METHOD FOR DOPING EPITAXIAL LAYERS USING DOPED SUBSTRATE MATERIAL This application claims priority under 35 USC § 119(e)(1) of provisional application No. 60/007,424, filed Nov. 21, 1995.

TECHNICAL FIELD OF THE INVENTION

This invention relates to the doping of epitaxial layers, and more particularly to a method for doping epitaxial layers using a doped substrate material.

BACKGROUND OF THE INVENTION

Many useful devices can be formed from thin epitaxial layers of semiconducting material grown on a substrate. For example, infrared detectors can be made from epitaxial layers of mercury cadmium telluride (HgCdTe) formed on a cadmium telluride (CdTe) or cadmium zinc telluride (CdZnTe) substrate. The electrical properties of an epitaxial layer depend in part upon whether the layer is formed as n-type material or p-type material. Because different types of devices require different electrical properties, the ability to create n-type or p-type materials in a controlled manner is very important.

N-type and p-type material may be formed by doping an epitaxial layer during either the growth of the layer or after growth. For example, dopants or impurities may be introduced into an epitaxial layer as the layer is grown by techniques such as liquid-phase-epitaxy (LPE), molecular beam epitaxy (MBE), vapor phase epitaxy (VPE), which include hot-wall epitaxy (HWE), chemical vapor deposition (CVD), metal-organic CVD (MOCVD), metal-organic vapor phase epitaxy (MOVPE), and organo-metallic vapor phase epitaxy (OMVPE). After the growth of the epitaxial layer, dopants may be introduced into the layer by techniques such as ion implantation and diffusion, or by the use of a diffusion source. The dopants for the epitaxial layer can be chosen to create either n-type or p-type layers, or distinct regions of n-type or p-type material within a layer.

In prior methods, an epitaxial layer was doped using either relatively slow diffusing dopants or intrinsic defects native to the epitaxial layer, such as vacancies created by post-growth annealing processes. Although it was recognized that rapidly diffusing dopants or impurities could be used to extrinsically dope the epitaxial layer, rapidly diffusing impurities were avoided for the following reasons. Because rapidly diffusing impurities tended to migrate to the substrate, the surface of the epitaxial layer, or the interface between the epitaxial layer and the substrate, these impurities would not uniformly disperse throughout the layer. Furthermore, an electrical p-n junction could be created between epitaxial layers by doping one layer with an n-type dopant and doping another layer with a p-type dopant. If a rapidly diffusing n-type or p-type dopant was used, however, such dopant would migrate between the layers. In other words, it was difficult to localize and uniformly distribute a rapidly diffusing impurity in a specific layer.

Accordingly, a need has arisen for a method for the controlled doping of epitaxial layers and related materials to create uniform n-type and p-type material.

SUMMARY OF THE INVENTION

In accordance with the teachings of the present invention, the disadvantages and problems associated with previously developed methods for doping epitaxial layers have been substantially reduced or eliminated.

According to one embodiment of the present invention, a method is provided for producing either an n-type or p-type epitaxial layer using a doped substrate material. The method comprises four steps. Those steps are: growing a substrate, preferably from a material to which an epitaxial layer can be lattice-matched; doping the substrate with a predetermined concentration of dopant, where, in a preferred embodiment, the dopant possesses the ability to rapidly diffuse throughout the substrate; growing an epitaxial layer on the doped substrate; and annealing the epitaxial layer and the doped substrate, thereby causing the dopant to diffuse from the substrate into the epitaxial layer.

According to another embodiment of the present invention, a method for producing an n-type or a p-type epitaxial layer using doped substrate material includes growing a substrate, doping the substrate with a predetermined concentration of dopant, partially dissolving the doped substrate in an epitaxial melt solution, and growing an epitaxial layer on the substrate from the epitaxial melt, during which the dopant is incorporated into the epitaxial layer.

An important technical advantage of the present invention includes providing a process for forming uniformly doped n-type and p-type epitaxial layers using rapidly diffusing dopants.

A second important technical advantage of the present invention is that higher doping concentrations can be produced in the epitaxial layer. According to the present invention, the substrate is doped with a predetermined concentration of dopant. Because the substrate is substantially thicker than the epitaxial layer, a relatively large amount of dopant is available for introduction into the epitaxial layer.

A third important technical advantage of the present invention is a reduction in the tendency of dopants or impurities to migrate out of the epitaxial layer into the substrate.

A fourth important technical advantage of the present invention is reducing the variation in doping concentration of an epitaxial layer related to the thickness of the layer.

BRIEF DESCRIPTION OF THE DRAWINGS

For a more complete understanding of the present invention, and the advantages thereof, reference is now made to the following description taken in conjunction with the accompanying drawings, in which:

FIGS. 1A–1C are sectional views of a device as it is being formed according to a first embodiment of the present invention;

FIGS. 2A–2C are sectional views of a device as it is being formed according to a second embodiment of the present invention;

FIG. 3 is a flow diagram that illustrates a process for producing n-type or p-type epitaxial layers according to the first embodiment of the present invention shown in FIG. 1; and FIG. 4 is a flow diagram that illustrates a process for producing n-type or p-type epitaxial layers according to the second embodiment of the present invention shown in FIG. 2.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

An epitaxial layer can be grown on a substrate material. For example, an epitaxial layer formed of mercury cadmium telluride (HgCdTe) can be grown on a substrate formed from cadmium telluride (CdTe) or cadmium zinc telluride (CdZnTe). The substrate may introduce certain impurities into the epitaxial layer during growth of the epitaxial layer and/or during post annealing operations, which occur after growth of the layer. If the concentration of impurities in the epitaxial layer is substantial, these impurities can affect the electrical properties of the layer. In particular, the impurities in a substrate can be used to form n-type or p-type material in an epitaxial layer.

Previously, the introduction of impurities from the substrate into the epitaxial layer was unintentional. For example, a CdZnTe substrate could contain trace amounts of copper (Cu), a p-type impurity, even after the substrate material was heavily refined. These p-type impurities would diffuse out of the substrate into the epitaxial layer. As indicated, the effect of the impurities upon the electrical properties of the epitaxial layer depended on the concentration of impurities in the layer. The concentration of impurities depended in part upon the thickness of the layer. Therefore, if the epitaxial layer was grown as a relatively thick layer, the diffusion of the p-type Cu impurity from the substrate into the epitaxial layer would not substantially affect the layer's electrical properties.

In contrast, the present invention adds impurities to the substrate for the purpose of intentionally introducing these impurities into the epitaxial layer. Because the number of impurities in the doped substrate is significantly higher than in an undoped substrate, more impurities will diffuse into the epitaxial layer. Consequently, the introduction of the impurities from a doped substrate into the epitaxial layer affects the electrical properties of the layer. More specifically, n-type or p-type material can be formed in the epitaxial layer.

Therefore, in accordance with the present invention, a method is provided for doping epitaxial layers using a doped substrate to form either n-type or p-type material. The method includes doping the substrate with a predetermined concentration of n-type or p-type dopant. The doped substrate serves as the source of dopant for the epitaxial layer. The dopant can be introduced into the epitaxial layer by either of two fundamentally different processes, or a combination of both. The first process is described in more detail with reference to FIGS. 1 and 3; the second process is described in more detail with reference to FIGS. 2 and 4.

FIGS. 1A–1C are sectional views of a device 10 as it is being formed according to the first process of the present invention. In this case, dopant from the substrate is introduced into the epitaxial layer during post annealing operations.

FIG. 1A shows partially formed device 10 having a substrate 12 throughout which a dopant 14 is uniformly distributed. Substrate 12 is preferably formed of cadmium telluride (CdTe) or cadmium zinc telluride (CdZnTe), because epitaxial layers may be lattice-matched to such substrate materials. Substrate 12 may have a thickness between about 0.125 cm and 0.152 cm.

Dopant 14 is distributed at a predetermined concentration throughout substrate 12. Dopant 14 is preferably a fast diffuser. The choice of dopant 14 varies, depending upon whether a p-type layer or an n-type layer will be formed. Some general classes of impurities which are considered to be fast diffusing p-type dopants include the alkali metals of Group IA of the periodic table of elements and the noble metals of Group IB. The alkali metals may be lithium (Li), sodium (Na), and potassium (K); the noble metals are copper (Cu), silver (Ag), and gold (Au). These p-type impurities diffuse rapidly in a variety of compound matrixes such as HgCdTe, CdTe, and CdZnTe. Impurities which produce n-type doping in HgCdTe may diffuse more slowly than the cited p-type impurities. Nonetheless, n-type dopants which are considered to be fast diffusers include indium (In) and gallium (Ga). Typical concentrations for dopant 14 in substrate 12 range between about $1 \times 10^{15}$ atoms/cm$^3$ and $5 \times 10^{17}$ atoms/cm$^3$.

FIG. 1B shows an undoped epitaxial layer 16 formed over substrate 12. In a preferred embodiment, epitaxial layer 16 is formed from HgCdTe. Epitaxial layer 16 may have a thickness between 30 microns and 90 microns. Because substrate 12 has a thickness between 0.125 cm and 0.152 cm, it is substantially thicker than epitaxial layer 16. Consequently, a relatively large amount of dopant 14 is available for introduction into epitaxial layer 16 from substrate 12.

FIG. 1C shows epitaxial layer 16 into which dopant 14 has been introduced. Substrate 12 is the source for dopant 14 that is introduced into epitaxial layer 16. The concentration of dopant 14 in epitaxial layer 16 ranges between $1 \times 10^{15}$ atoms/cm$^3$ and $5 \times 10^{17}$ atoms/cm$^3$, depending upon the concentration in substrate 12. It should be understood, however, that the concentration of dopant 14 in epitaxial layer 16 may differ from the concentration of dopant 14 in substrate 12. The first process, by which device 10 is formed, is described in more detail with reference to FIG. 3.

FIGS. 2A–2C are sectional views of a device 110 as it is being formed according to the second process of the present invention. In this case, dopant from the substrate is introduced into the epitaxial layer during the growth of the epitaxial layer.

FIG. 2A shows partially formed device 110 having a substrate 112 throughout which a dopant 114 is uniformly distributed at a predetermined concentration. Like substrate 12 shown in FIG. 1, substrate 112 is preferably formed of CdTe or CdZnTe. Substrate 112 may have a thickness between about 0.125 cm and 0.152 cm.

Similar to dopant 14 shown in FIG. 1, the choice of dopant 114 varies, depending upon whether n-type or p-type material is desired. Unlike dopant 14, however, dopant 114 may be a relative slow diffuser in HgCdTe. Thus, although fast-diffusing Group IA and IB impurities are preferred for dopant 14 used to make p-type material according to the first process, slow-diffusing Group VA impurities, such as phosphorous (P), arsenic (As), and antimony (Sb), may be used for dopant 114 in this second process. N-type dopants may be boron (B), aluminum (Al), indium (In), fluorine (F), chlorine (Cl), bromine (Br), and iodine (I).

FIG. 2B shows a portion of a doped epitaxial layer 116 formed over substrate 112. Epitaxial layer 116 is preferably made of HgCdTe. Dopant 114 is incorporated into epitaxial layer 116 from substrate 112 as epitaxial layer 116 is formed. The concentration of dopant 114 in epitaxial layer 116 may range between $1 \times 10^{15}$ atoms/cm$^3$ and $1 \times 10^{18}$ atoms/cm$^3$. Dopant 114 is homogenized, or distributed uniformly, throughout the epitaxial layer during the annealing processes which occur after the layer is grown.

FIG. 2C shows a fully-formed epitaxial layer 116 into which dopant 114 has been introduced. Similar to substrate 12 and epitaxial layer 16 illustrated in FIG. 1, substrate 112 is substantially thicker than epitaxial layer 116.

FIGS. 3 and 4 illustrate the processes by which devices 10 and 110, respectively, are formed.

FIG. 3 shows a flow chart for a first process 30 by which a dopant may be introduced into an epitaxial layer. First process 30 utilizes rapidly diffusing dopants and operates primarily during the post annealing operations which follow the growth of the epitaxial layer on a substrate. The post annealing temperatures and times can be selected to permit the controlled diffusion of the dopant species into the epitaxial layer. Referring to FIGS. 1 and 3, the steps for first process 30 are as follows.

At step 32, a substrate 12 is grown, by a horizontal Bridgman process for example, and doped with a predetermined concentration of dopant 14. Substrate 12 may comprise a layer of CdTe or CdZnTe bulk material. Dopant 14 can be incorporated into substrate 12 either at growth or by post-growth doping. For example, if dopant 14 is added to a substrate melt, the dopant can be incorporated into substrate 12 as the substrate is grown from the melt by a Bridgman process. In addition, dopant 14 can be incorporated into substrate 12 after its growth. For example, a layer of dopant 14 may be deposited onto the surface of substrate 12 by electroless plating or ion diffusion and then incorporated into the substrate by interdiffusion.

Preferably, dopant 14 possesses the ability to diffuse rapidly through the material. Rapidly diffusing dopants include Cu, Ag, Au, Na, Li, K, Ga and In. Thus, to create n-type material, substrate 12 may be doped with Ga or In. To create p-type material, substrate 12 may be doped with Cu, Ag, Au, Na, Li, or K.

Next, at step 34, an epitaxial layer 16 is grown upon the substrate by any one of several methods, such as liquid phase epitaxy (LPE), molecular beam epitaxy (MBE), or vapor phase epitaxy (VPE). LPE is preferred. Epitaxial layer 16 may be formed from a HgCdTe melt. In first process 30, some amount of dopant 14 may diffuse into epitaxial layer 16 as the layer is being grown. Most doping, however, occurs at the next step.

At step 36, substrate 12 and epitaxial layer 16 are annealed at elevated temperatures, during which the doping occurs. The annealing process promotes rapid diffusion of dopant 14 throughout epitaxial layer 16. The normal annealing temperatures and times used for most epitaxial layers are sufficient to cause more rapidly diffusing dopant species to totally permeate epitaxial layer 16. For example, a rapidly diffusing dopant may be uniformly distributed throughout epitaxial layer 16 by annealing at 400° C. for four hours, and then at 250° C. for two days. On the other hand, the annealing temperatures and times can be increased to permit slower diffusing species of dopants to also diffuse into epitaxial layer 16. Thus, when substrate 12 has been deliberately doped with the desired dopant species, the subsequent doping of the deposited epitaxial layer can be effected by the proper selection of post-annealing temperatures and times.

Because substrate 12 is substantially thicker than epitaxial layer 16, substrate 12 can be doped with a large amount of dopant 14 relative to epitaxial layer 16. When dopant 14 is incorporated into epitaxial layer 16 from substrate 12, the diffusion of dopant 14 into the epitaxial layer does not significantly deplete the dopant in the substrate. In addition, the dopant can be more uniformly distributed throughout epitaxial layer 16.

FIG. 4 shows a flow chart for a second process 40 by which a dopant may be introduced into an epitaxial layer. Second process 40 may utilize slower diffusing dopants, such as P, As, and Sb, for p-type and B, Al, In, F, Cl, Br, and I for n-type. Second process 40 operates primarily during the growth of the epitaxial layer and requires that the substrate surface be partially dissolved in an epitaxial melt solution. The partial dissolution of the substrate introduces the dopant into the epitaxial melt adjacent the substrate surface. The dopant is then incorporated into the epitaxial layer during the layer's growth. Referring to FIG. 2 and 4, second process 40 comprises the following steps.

At step 42, a substrate 112 is grown and doped with a predetermined concentration of a dopant 114. Preferably, substrate 112 is formed of CdTe or CdZnTe, to which an epitaxial layer can be lattice-matched. Dopant 114 may be incorporated into substrate 112 by any of several techniques. For example, dopant 114 may be dissolved in solution. Afterwards, substrate 112 is immersed in the dopant solution, causing dopant 114 to plate itself upon the surface of the substrate. Dopant 114 is then interdiffused throughout the bulk of substrate 112 so that it is no longer disposed only on the surface of substrate 112. For example, the substrate may be pre-annealed at a temperature of 500° C. for 4–7 days to distribute dopant 114. The doping process may produce a dopant concentration ranging from about $1 \times 10^{14}$ atoms/cm$^3$ to over $1 \times 10^{17}$ atoms/cm$^3$ throughout substrate 112.

Next, at step 44, substrate 112 is immersed in an epitaxial melt solution so that the surface of substrate 112 is partially dissolved. The partial dissolution of substrate 112 enriches the epitaxial melt with the dopant species proximate the surface of the substrate.

At step 46, an epitaxial layer 116 is grown on substrate 112. This subsequent growth of epitaxial layer 116 incorporates the dopant of the epitaxial melt into epitaxial layer 116. Although dopant 114 may also diffuse into epitaxial layer 116 from substrate 112 during subsequent annealing operations, and thus become more uniformly distributed, post-annealing operations are not required for second process 40.

Although the present invention and its advantages have been described in detail, it should be understood that various changes, substitutions, and alterations can be made herein without departing from the spirit and scope of the invention as defined by the appended claims.

What is claimed is:

1. A method for producing an n-type or p-type epitaxial layer, comprising the steps of:

A. growing a substrate, wherein the substrate is formed from a group consisting of cadmium telluride or cadmium zinc telluride;

B. dissolving a dopant in a solution;

C. adding a dopant into the subsrtate by immersing the substrate in the dopant solution;

D. interdiffusing the dopant throughout the substrate;

E. partially dissolving the doped substrate in an epitaxial melt solution;

F. growing an epitaxial layer on the substrate from the epitaxial melt, solution wherein the epitaxial layer is formed from mercury cadmium telluride; and G. annealing said epitaxial layer and said undissolved doped substrate, until said undissolved doped substrate interdiffuses into said epitaxial layer to form a uniform distribution of dopant therein.

2. The method of claim 1, wherein the epitaxial layer is formed as p-type material.

3. The method of claim 2, wherein the dopant is a material selected from the group consisting of phosphorus, arsenic, antimony.

4. The method of claim 1, wherein the epitaxial layer is formed as n-type material.

5. The method of claim 4, wherein the dopant is a material selected from the group consisting of boron, aluminum, indium, fluorine, chlorine, bromine, and iodine.

* * * * *